(12) United States Patent
Yamamoto et al.

(10) Patent No.: US 6,306,526 B1
(45) Date of Patent: Oct. 23, 2001

(54) SEMICONDUCTOR PACKAGING METAL LID

(75) Inventors: Tetsuya Yamamoto, Penang; Shigeki Kawamura, Mine; Sanae Taniguchi, Saitama, all of (JP)

(73) Assignees: Sumitomo Metal (SMI) Electronics Devices Inc.; Senju Metal Industry Co. Ltd., both of (JP)

( * ) Notice: Subject to any disclaimer, the term of this patent is extended or adjusted under 35 U.S.C. 154(b) by 0 days.

(21) Appl. No.: 09/394,798

(22) Filed: Sep. 10, 1999

(51) Int. Cl.7 .................................................. B32B 15/01

(52) U.S. Cl. .......................... 428/645; 257/704; 428/576; 428/606; 428/681; 428/926; 438/121; 438/125

(58) Field of Search ..................................... 428/645, 576, 428/606, 681, 926; 228/56.3; 438/121, 125; 53/404, 81; 257/704

(56) References Cited

U.S. PATENT DOCUMENTS 4,020,987 * 5/1977 Hascoe .................................. 428/645
5,414,300 * 5/1995 Tozawa et al. ...................... 428/645

FOREIGN PATENT DOCUMENTS 2550667   8/1996   (JP) .

* cited by examiner

*Primary Examiner*—Robert R. Koehler
(74) *Attorney, Agent, or Firm*—Webb Ziesenheim Logsdon Orkin & Hanson, P.C.

(57) ABSTRACT

A metal lid for use in hermetic sealing of a semiconductor package comprises a lid body comprising a metal plate having a solder layer secured to the entire surface of the metal lid by cladding. The lid is placed in position on a substrate and can seal the resulting package by heating to melt the solder layer. The lid can be readily mass-produced and can seal the package with high seal reliability and without deposition of solder balls on the inner wall of the package.

12 Claims, 1 Drawing Sheet

SEMICONDUCTOR PACKAGING METAL LID

BACKGROUND OF THE INVENTION

The present invention relates to a semiconductor packaging metal lid for use in hermetically sealing a semiconductor element mounted on an insulating substrate.

A class of hermetically sealed semiconductor packages is manufactured by placing a sheet- or cap-like lid over a semiconductor element mounted on an insulating substrate such as a ceramic substrate so as to enclose the semiconductor element and by subsequently joining peripheral sealing areas of the substrate and the lid with a sealer for hermetic sealing. These packages are primarily employed in applications where thermal resistance and a high level of durability and reliability are required. The sealer may be soft solder for soldering, hard solder for brazing, or glass. Of these materials, soft solder (which is often referred to merely as solder) is lowest in melting temperature and is advantageous in that sealing can be performed at a relatively low temperature.

The lid is usually made of a ceramic or metallic material. In the case of sealing by soldering with soft solder, a ceramic lid must be metallized to form a thick metal layer on the peripheral sealing area of the lid to enable the lid to be bonded by soldering, which adds to the production costs of the lid. In contrast, a metal lid can be directly bonded by soldering without such a metallizing procedure and is advantageous from an economic viewpoint.

A typical metal lid known in the art comprises a lid body comprising a metal plate of a predetermined shape having a layer of solder serving as a sealer only in the peripheral sealing area on one surface of the lid body. The solder employed for this purpose is a class of soft solder called high-temperature solder which has a melting temperature around 300° C. Examples of such solder includes Pb/Sn alloys and Pb/Sn/Ag alloys.

The metal lid having the solder layer in the peripheral sealing area is placed on a substrate (on which a semiconductor element has been mounted) such that the peripheral solder layer of the lid faces and contacts a peripheral sealing area of the substrate, with the semiconductor element being enclosed in the space formed between the lid and the substrate. Then, the assembled substrate and lid are heated by an appropriate means such as an oven at a temperature sufficient to melt the solder in order to join the lid to the substrate, thereby forming a hermetic seal in the sealing area and producing a hermetically sealed semiconductor package.

Such a packaging metal lid for use in hermetic sealing, which comprises a lid body and a solder layer for sealing in a peripheral sealing area, has been produced either by (1) applying a solder paste comprising a solder powder and a flux to the peripheral sealing area of the lid body by printing followed by reflowing to evaporate the flux and form a solder layer, or (2) preforming a solder sheet in the form of a rectangular annulus (corresponding to the shape of the sealing area) by punching from a blank sheet of solder, placing the preformed solder sheet in position on the lid body, and securing it to the solder sheet by spot welding in several locations.

Process (1) which is conducted by printing with a solder paste is less expensive and is more readily adaptable to mass production than Process (2) which involves punching of a blank solder sheet and spot welding. However, Process (1) often causes part of the flux in the solder paste to remain in the solder layer after reflowing, thereby forming voids in the solder layer. The residual flux entrapped in the voids may vaporize during heating to melt the solder layer for hermetic sealing and cause the voids to burst, which in turn causes the molten solder to splash around in the form of solder balls, which may be deposited on the interconnecting lines and semiconductor element on the substrate. The deposited solder balls have a diameter which is as small as from about 3 $\mu$m to about 5 $\mu$m, for example, but they may nevertheless seriously impede the performance of the semiconductor element.

In Process (2), the above-mentioned problem attributable to the residual flux is eliminated. However, as the blank solder sheet is too soft to be handled easily, the manufacturing operations which includes punching the blank solder sheet into a preformed solder sheet having a rectangular annular shape, placing the preformed solder sheet in position on the lid body, and securing it to the lid body by spot welding involve many difficulties and greatly interfere with the productivity of the process.

Furthermore, as pointed out in Published Japanese Patent 2,550,667, spot welding is performed by pressing an electrode of a spot welder against the solder sheet, which causes the solder sheet in the pressed spot to sink and the surrounding area of the solder sheet to rise, thereby making the solder sheet bumpy. The bumpiness of the solder sheet may lead to misplacement of the lid on the package substrate before hermetic sealing of the package, or may adversely affect the dimensional accuracy of the resulting semiconductor package due to the uneven thickness of the solder layer. Moreover, the tightness of the hermetic seal formed by the bumpy solder layer may be degraded due to injury by the raised portions or retention of air in the depressed portions.

In order to cope with these problems, it is proposed in Published Japanese Patent 2,550,667 to secure the solder sheet to the lid body by a non-contact heating means capable of localized heating such as a laser beam, instead of by spot welding. As a result, the above-described problems attributable to the bumpiness of the solder sheet can be eliminated. However, the problem of low productivity due to the poor handling properties of the soft solder sheet remains unresolved. Therefore, Process (2) is less adaptable to mass production than Process (1).

SUMMARY OF THE INVENTION

It is an object of the present invention to provide a packaging metal lid for use in hermetic sealing of a semiconductor package in which the above-described various problems are eliminated. Thus, the metal lid according to the present invention which has a solder layer on a lid body is suitable for mass production since no difficult-to-handle material is used in the production thereof, it is free from voids or residual flux in the solder layer, and it does not cause the formation of solder balls during melting the solder layer for hermetic sealing.

Another object of the present invention is to improve the reliability of hermetic seals of semiconductor packages in use. The hermetic seals formed with a high-temperature solder such as a Pb/Sn or Pb/Sn/Ag alloy which have been employed in semiconductor packages have a low resistance to thermal shocks, and when subjected to 1000 cycles of repeated thermal stress, for example, in a thermal cycle test, they may be cracked, leading to leakage or failure of the hermetic seals. This indicates that the reliability of these hermetic seals may be lost during use of the semiconductor packages for a prolonged period.

According to the present invention, a semiconductor packaging metal lid suitable for use in hermetic sealing of a semiconductor package is made of a solder-clad metal plate. Namely, the metal lid comprises a metal plate having a solder layer secured to the metal plate by cladding. Thus, unlike conventional lids in which a lid body has a solder layer only in the peripheral sealing area thereof, the lid according to the present invention has a solder layer which covers the entire surface of a lid body on one side thereof and which is secured to the lid body by cladding. It has been found that the formation of a solder layer on the entire surface of a lid body does not cause any significant problem when it is melted during hermetic sealing, since it has a limited thickness.

Preferably the solder used for cladding to the metal plate is a lead-based alloy which has a solidification temperature range falling within the range between about 240° C. and about 310° C.

DESCRIPTION OF EMBODIMENTS OF THE INVENTION

Figure 1:
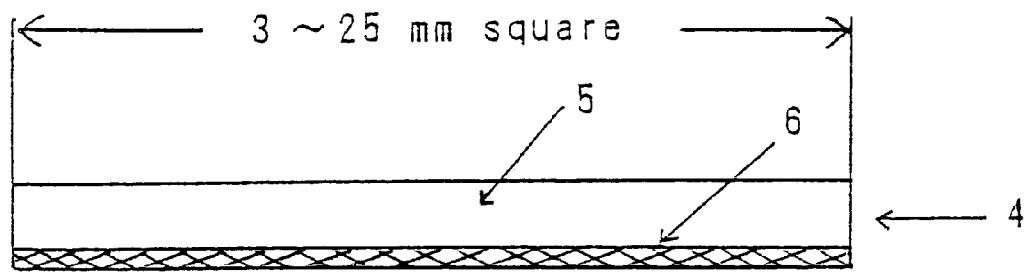
FIG. 1(a) is a schematic cross-sectional view of a metal lid according to the present invention.
FIG. 1(b) is a schematic cross-sectional view of a substrate to be hermetically sealed by the lid to form a semiconductor package.
Figure 1:
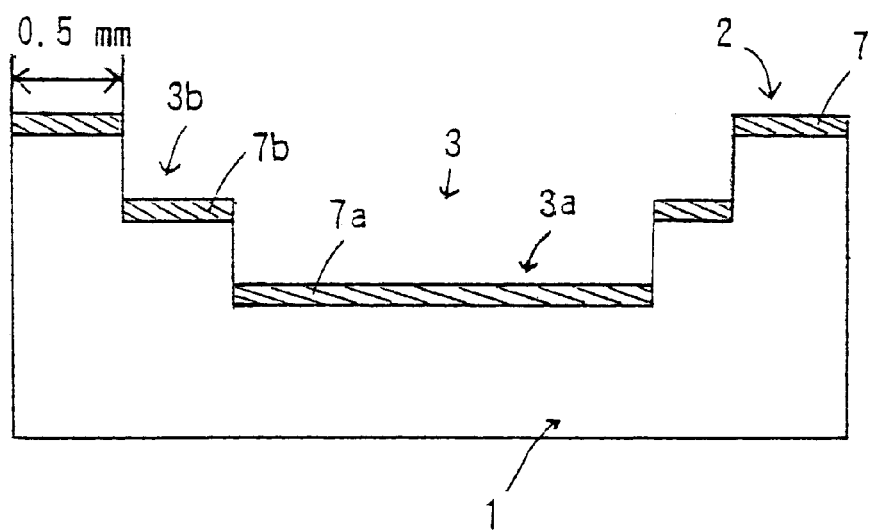

The metal lid according to the present invention may be employed to hermetically seal any type of semiconductor package, provided that the substrate of the semiconductor package used to support a semiconductor element is made of an insulating material capable of withstanding a temperature sufficient to melt the solder layer of the lid such that the package can be hermetically sealed without significant damage to the substrate. Typical insulating materials having such thermal resistance are ceramics. Thus, the metal lid according to the present invention is typically used to seal a ceramic package in which a ceramic substrate is used to support a semiconductor element, although other materials having the above-described thermal resistance may be employed for the substrate.

The ceramic substrate in the ceramic package may be made of any ceramic material, such as alumina, aluminum nitrate, mullite, glass ceramic material, or the like, which have been used in ceramic packages. Of course, the ceramic substrate may be a multilayered ceramic substrate. The ceramic substrate and its interconnecting lines may be prepared by any appropriate technique.

The metal lid according to the present invention may be flat. In this case, the substrate should have a recess which is large enough to receive therein a semiconductor element to be mounted thereon. Alternatively, the metal lid may be shaped by a suitable shaping technique such as press-forming, preferably in the form of a flanged cap defining an inner space of a size sufficient to enclose a semiconductor element mounted on a substrate and a bottom flange forming a sealing area. The solder layer of the cap-shaped lid faces the inner space. In this case, the substrate may be flat. The present invention is hereinafter described by reference to a flat lid, but it can be readily adapted to a shaped lid such as a cap-shaped lid by those skilled in the art.

A flat lid has dimensions sufficient to completely cover the opening of the recess formed in the substrate and make a seal around the opening. The lid is placed on the substrate so as to cover the opening, and the gap between the lid and the substrate in a sealing area which surrounds the opening is then hermetically sealed by melting the solder layer secured to the lid.

In the case of a semiconductor package having a ceramic substrate, i.e., a ceramic package, the ceramic substrate itself is not solderable or wettable by molten solder. Therefore, the surface of the substrate in the sealing area which surrounds the opening and which is to be joined to the lid by sealing with solder must be modified to render it solderable. For this purpose, a metallized layer having good solderability may be formed on the surface of the substrate in the sealing area thereof. The metallized layer is preferably formed by metallizing with a refractory metal such as W (tungsten) or Mo (molybdenum) followed by successive Ni plating and Au plating since the resulting Au-plated surface of the metallized layer has particularly high solderability (wettability by molten solder), although any metallized layer which can be applied to a ceramic substrate to provide it with solderability may be employed.

The substrate having a semiconductor element mounted thereon in the recess of the substrate is covered by a metal lid for sealing. According to the present invention, the sealing metal lid is made of a solder-clad metal plate which comprises a metal plate having a solder layer clad on one surface thereof. The condition of the other surface of the metal plate is not critical, and it may be bare or coated with a suitable paint or by plating, or even covered by a solder layer.

The metal plate in the metal lid is a lid body and the clad solder layer can form a hermetic seal between the lid body and the substrate upon melting during a sealing process. A preferable thickness is from about 0.1 mm to about 1 mm for the metal plate (lid body), and from about 10 $\mu$m to about 80 $\mu$m and more preferably from 20 $\mu$m to 50 $\mu$m for the clad solder layer.

The metal lid comprising a solder-clad metal plate can be prepared by subjecting a metal plate and a solder sheet together (after being placed one on another) to cold or hot rolling. Whether hot or cold, the rolling is preferably performed at a reduction ratio in the range of from about 30% to about 70%. From the solder-clad metal plate, a sealing metal lid can be produced by punching with a press, for example, to form a predetermined contour for the lid, which is normally rectangular but is not limited thereto. The punched-out flat lid may be formed or shaped, for example, by press-forming simultaneously with or after the punching. Since the solder sheet, which is soft and is difficult to punch as such, is firmly secured to the much harder metal plate by cladding and the shape to be punched out is solid rather than annular, the punching operation and handling of the punched-out pieces are easy. Therefore, the sealing metal lid according to the present invention is readily adaptable to mass production with no substantial problems in handling.

Preferably the metal plate of the metal lid has a thermal expansion coefficient which is close to that of the substrate to which the lid is joined. In the case of a ceramic package having a ceramic substrate, examples of appropriate metals for the metal plate include 42-alloy (Fe-42Ni alloy) and Kovar (Fe-29Ni-17Co alloy), although other metals can be used.

The solder sheet to be clad to the metal plate may have any appropriate alloy composition. Preferably it is formed from a lead-based solder alloy having a solidification temperature range (a range between the liquidus temperature and the solidus temperature) which falls within the range of from about 240° C. to about 310° C. Thus, the solder alloy preferably has a liquidus temperature of about 310° C. or below and a solidus temperature of about 240° C. or above for the following reason.

In order to avoid any damage to the semiconductor element by the effect of heat during sealing achieved by melting the solder, it is desirable that the sealing be performed at a temperature of 330° C. or below. When the solder alloy has a liquidus temperature of 310° C. or below, it is possible to completely melt the solder at a temperature of 330° C. or below in order to perform the desired hermetic sealing. In most cases, the semiconductor package is heated again in a subsequent step of mounting the package on a mother board, which is normally in the form of a printed circuit board. This mounting is usually performed by soldering and involves heating at a temperature slightly above 200° C. When the solder alloy used to seal the package has a solidus temperature of 240° C. or above, melting of the solder in the hermetic seal of the package will be avoided in the subsequent heating step to mount the package on the mother board, whereby the hermetic seal of the package remains sound after the subsequent heating. The solidification temperature range of the solder alloy more preferably falls within the range of from about 250° C. to about 300° C.

In order to ensure that the hermetic seal of the package has good seal reliability, it is desirable that the solder alloy used for hermetic sealing be capable of forming a hermetic seal having good resistance to thermal shocks. For this purpose, the above-mentioned lead-based solder alloy preferably contains Sn (tin) and In (indium) for the following reason.

In a lead-based solder alloy, addition of tin improves the wetting properties of the molten solder on an Au-plated surface of the metallized layer formed in the sealing area of the substrate, thereby enhancing the adhesion of the hermetic seal achieved by the solder and improving the resistance of the seal to thermal shocks. Preferably the solder alloy has a tin content of about 2% to about 6% by weight. A lower tin content may not be sufficient to attain the above-described effect adequately, while a higher tin content may also cause the formation of a hermetic seal having a decreased resistance to thermal shocks.

Addition of indium to a lead-based solder alloy is effective for preventing cracking of a hermetic seal formed from the solder alloy, thereby improving the resistance of the seal to thermal shocks. This is because indium can minimize the formation of brittle Au-Sn or Pb-Au alloy phase caused by a reaction of Au in the Au-plated surface of the substrate with Sn or Pb in the solder alloy. The appropriate indium content to obtain such an effect is, when the solder alloy contains from about 2% to about 6% tin, in the range of from about 0.5% to about 2% by weight. A lower indium content may not be sufficient to attain the above-described effect adequately. The presence of more than 2% by weight of indium in the solder alloy may cause the resulting hermetic seal to have decreased long-term sealing properties.

The lead-based solder alloy may additionally contain at least one element such as Bi (bismuth), which is effective for lowering the melting point of the alloy, in an amount sufficient to lower the solidification temperature range of the solder alloy such that it falls within the range of from about 240° C. to about 310° C. Thus, the solidification temperature range of the solder alloy can be effectively controlled by the content of such an element. One or more other elements which have been frequently added to solder alloys such as Ag (silver) may be added to the solder alloy in a total amount of 2% by weight or less.

By way of example, a solder alloy suitable for use in the present invention consists essentially, on a weight basis, of about 2–15% Bi, about 2–6% Sn, about 0.5–2% In, about 0.5–2% Ag, and a balance of Pb. This solder alloy contains Bi with a minimized amount of Ag and hence has a low solidification temperature range falling within the range of from about 240° C. to about 310° C. The Sn content of the solder alloy is sufficient to provide the solder with good wetting properties on the Au-plated surface of the metallized layer formed in the sealing area of the substrate. The In content is sufficient to provide the hermetic seal formed by melting of the solder with good resistance to thermal shocks.

An exemplary embodiment of a flat metal lid according to the present invention has a cross-sectional structure shown in FIG. 1(a), while a substrate to be hermetically sealed by the lid to form a semiconductor package has a cross-sectional structure shown in FIG. 1(b).

As shown in these figures, a ceramic substrate 1 has a sealing area 2 on its top surface which surrounds a recess 3 for receiving a semiconductor element (not shown) therein. A lid 4 has a metal lid body (metal plate) 5 to which a solder layer 6 is secured by cladding. Thus, the metal plate (lid body) is entirely covered with the solder layer on one surface. Although not shown, the other surface of the metal plate may be a coated surface. The sealing area 2 of the substrate 1 is to be joined to the lid 4 for hermetic sealing with the aid of the solder layer 6 of the lid. For this purpose, the sealing area 2 has a metallized layer 7 formed by metallizing with a refractory metal such as W or Mo followed by Ni plating and then Au plating. Both the substrate 1 and lid 4 may have an outer shape in a horizontal section in the form of a square measuring from 3 mm to 25 mm on a side.

In the depicted embodiment, the recess 3 formed in the ceramic substrate 1 has two steps and defines lower and upper recesses 3a and 3b. The lower recess 3a of the substrate provides a space for receiving a semiconductor element (not shown) therein, while the upper recess 3b provides a bottom surface (surrounding the opening of the lower recess) on which electrodes for wire bonding is formed. The element (which may be an IC chip) is attached to the bottom surface of the lower recess 3a and interconnected with the substrate by wire bonding. In order to facilitate die attachment (attachment of the semiconductor element), the bottom surface of the lower recess 3a has the same Ni- and Au-plated metallized layer 7a as formed in the sealing area 2 of the substrate. The same metallized layer 7b is also formed on the bottom surface of the upper recess 3b to facilitate the formation of a conductor pattern between bonding wires and the element. It should be understood that the present invention is not limited to the depicted or described embodiment.

The metal lid according to the present invention as depicted in FIG. 1(a) can be used to hermetically seal the substrate as depicted in FIG. 1(b) having a semiconductor element mounted thereon in the following manner.

On the substrate 1, the lid 4 is placed in position to cover the substrate, with its solder layer 6 facing down to contact the sealing area 2 of the substrate. The resulting assembly (covered substrate) is Heated by an appropriate heating means such as an oven at a temperature slightly higher (e.g., about 10° C. to 30° C. higher) than the melting temperature (liquidus temperature) of the solder alloy used to form the solder layer 6. Such heating causes the solder layer to completely melt and bond to the sealing area 2 surrounding the opening of the recess 2, thereby forming a hermetic seal between the substrate 1 and the metal lid 4 to give a semiconductor package. The duration of such heating is normally in the range of from about 10 seconds to about 10 minutes. In order to ensure the perfection of a hermetic seal formed by melting of the solder layer, it is preferred that an appropriate pressure be applied, e.g., by placing a weight on the lid. The pressure may be on the order of from about 20 to about 100 g/cm$^2$. The heating atmosphere is not critical, but preferably heating is performed in a non-oxidizing gas such as a nitrogen gas, a mixed hydrogen-nitrogen gas, or an argon gas.

The metal lid 4 according to the present invention has a solder layer 6 which entirely covers one surface of the lid body 5 facing the substrate 1. As a result, the solder layer 6 in the area surrounded by the sealing area 2 of the substrate 1 or positioned over the recess 3 thereof is exposed to the semiconductor element mounted on the substrate in the recess while it is heated to melt it and form a hermetic seal in the sealing area. However, since the solder layer is thin, melting of the exposed solder layer during the heating step does not cause any inconvenience or problem such as dropping of solder balls, and does not bring about any significant adverse effect on the performance of the semiconductor element.

The following example is presented to further illustrate the present invention, and it is to be considered in all respects as illustrative and not restrictive.

EXAMPLE

Various solder ribbons measuring 0.1 mm in thickness and 50 mm in width and having different alloy compositions were separately clad to a metal strip of Kovar measuring 0.7 mm in thickness and 50 mm in width by cold rolling together at a reduction ratio of 50%. The resulting solder-clad metal strips had a thickness of 40 µm for the solder layer and 0.35 mm for the metal plate.

The solder ribbons had the following alloy compositions on a weight basis:

Solder A: Pb-8% Bi-4% Sn-1% In-1 Ag alloy having a solidification temperature range of 250–295° C.;

Solder B; Pb-5% Sn alloy having a solidification temperature range of 252–295° C.; and Solder C: Pb-5% Sn-1.5% Ag alloy having a solidification temperature range of 280–296° C.

From each solder-clad metal strip, 3.8 mm-square metal lids were punched out by a press. The metal lids were subjected to the following tests.

(a) Solder Ball Test

A metal lid having a clad solder layer of Solder A was placed on an alumina-based rectangular ceramic substrate measuring 3.8 mm×3.8 mm×1.5 mm (height) in outer dimensions and having a rectangular recess (with no step) measuring 2.8 mm×2.8 mm×1 mm (depth) such that the lid exactly coincided with the substrate and perfectly cover the opening of the recess of the substrate. The ceramic substrate had a metallized layer formed by metallizing with tungsten followed by Ni plating and then Au plating in the sealing area thereof, which corresponded to the upper surface edge of the substrate surrounding the opening of the recess and which was to be joined to the lid.

After a 5-gram weight was placed on the lid which covered the substrate to give a pressure of 34.6 g/cm$^2$, the covered substrate was then heated in an oven in a nitrogen gas atmosphere at a temperature of 310±10° C. for such a period that the retention time at a temperature of 280° C. or above was in the range of 3±2 minutes. The heating caused the solder layer of the lid to melt, thereby bonding the lid to the ceramic substrate to produce a solder-sealed ceramic package.

Forty (40) sealed packages were produced in this manner and cut vertically across the center thereof. The cross section of each sealed package in the sealed area was observed under a scanning electron microscope (SEM). All the packages were found to be completely sealed with no detectable failure of sealing.

An additional 40 sealed packages produced in the same manner as above were cut horizontally at approximately halfway up the height of each package, and the bottom surface in the recess of the lower half of each substrate was observed under an SEM to detect solder balls deposited on the bottom surface. None of the packages had solder balls detected on the bottom surface.

For comparison, a conventional lid was produced by printing a 3.8 mm square Kovar plate (0.7 mm in thickness) with a solder paste containing Solder A with 10% flux to form a 0.5 mm-wide strip of the paste along the outer periphery of the square plate on one surface. The printed solder paste was reflowed and rinsed to give a metal lid having a solder layer only in the peripheral area. The lid was placed on the same ceramic substrate as above with its solder layer facing down such that the lid coincided with the substrate with the peripheral solder layer of the lid coinciding with the metallized upper edge surface of the substrate. The covered substrate was heated under the same conditions as described above to melt the solder layer and produce a solder-sealed ceramic package.

Forty (40) sealed packages were prepared in this manner using the above-described conventional lids, and the bottom surface in the recess of each substrate was observed under an SEM after the substrate was cut horizontally in the same manner as above. In 30 packages among the 40 packages, one or more solder balls were found to be deposited on the bottom surface of the recess of the substrate. These solder balls had a diameter of from about 3 µm to about 10 µm. Therefore, when hermetically sealed with the conventional lids, a considerable proportion of the resulting sealed packages would be rejected products.

(b) Seal Reliability Test

An alumina-based ceramic substrate having a recess of the shape shown in FIG. 1(b), i.e., a two-step recess was prepared. All the upward surfaces of the substrate, namely, the surface of the sealing area and the bottom surfaces of the upper and lower recesses had a metallized layer thereon formed by metallizing with tungsten followed by Ni plating and then Au plating. A metal lid having a clad-solder layer of Solder A on the entire surface according to the present invention was placed on the substrate with its solder layer facing down so as to coincide with the substrate and cover the opening of the recess of the substrate. The covered substrate was heated under the same conditions as described above with a 5-gram weight placed on the lid to melt the solder layer and produce a solder-sealed ceramic package.

The resulting package was subjected to heating at 240° C. for 5 minutes in air which simulated standard heating conditions encountered when a semiconductor package is mounted on a printed circuit board. The heated package was tested for seal reliability under the conditions shown in Table 1 below in accordance with MIL-STD testing methods. The test results are also shown in Table 1 in terms of the number of rejected packages/number of tested packages. The sealing properties were tested by using both a fine leak tester (for leaks of 1×10$^{-8}$ atm·cc/sec or higher) and a gross leak tester (application and release of a pressure of 6 kg/cm$^2$). Those packages which resulted in leakage in one or both tests were evaluated as rejected packages.

TABLE 1

| Test Categories | MIL-STD Method | Testing Conditions | Test Results |
| --- | --- | --- | --- |
| Sealing properties | 1014B | $1 \times 10^{-8}$ atm · cc/sec | 0/200 |
|  | 1014C | application and release of 6 kg/cm$^2$ |  |
| Resistance to thermal shocks | 1011C | 1000 cycles between −65° C. and 150° C. | 0/100 |
| Resistance to thermal cycles | 1010C | 15 cycles between −65° C. and 150° C. | 0/50 |
| Storage at high temperature | — | 150° C. for 1000 hours | 0/50 |

It can be seen from Table 1 above that the tested packages sealed by a lid according to the present invention had excellent seal reliability since they produced no rejected products with respect to any of the test categories of sealing properties, resistance to thermal shocks, resistance to thermal cycles (durability), and storage at high temperature.

(c) Resistance to Thermal Shocks

Using metal lids having a clad-solder layer made of Solder A, B, or C, ceramic packages were prepared in the same manner as described for the Seal Reliability Test. The packages were subjected to repeated thermal stresses by cooling to −65° C. and heating to 150° C. for 2000 cycles in accordance with MIL-STD 1011C. After every 100 cycles, the packages were tested for leakage (sealing failure) by a gross leak tester. The results are shown in Table 2 below in which the numerals in parentheses (such as 0/50) are the number of rejected (leaked) packages followed by the number of tested packages (=50).

TABLE 2

| Solder (Alloy) | Test Results |
| --- | --- |
| A (Pb/Bi/Sn/In/Ag) | No leakage after 2000 cycles (0/50) |
| B (Pb/Sn) | Considerable leakage after 100 cycles (38/50) |
| C (Pb/Sn/Ag) | Considerable leakage after 100 cycles (40/50) |

As can be seen from Table 2, Solder A, which is a Pb-based solder alloy containing small amounts of Sn and In, is superior to the other solders with respect to resistance to thermal shocks. Therefore, when a metal lid according to the present invention is used in applications where particularly good resistance to thermal shocks is required, it is desirable that such a solder alloy be employed to form a solder sheet to be clad to a metal plate to form the lid.

As has been described and illustrated since the metal lid for use in hermetic sealing of a semiconductor package according to the present invention comprises a lid body comprising metal plate having a solder layer secured to the entire surface thereof by cladding, it can be readily mass-produced and is easy to use. Unlike a conventional lid produced by printing a metal plate with a solder paste followed by reflowing which tends to form a solder layer containing a residual flux, the metal lid according to the present invention eliminates the occurrence of rejected products due to deposition of solder balls on the inner wall of the package caused by the residual flux in the solder layer. The metal lid can produce a hermetically sealed semiconductor package having good seal reliability particularly when the solder layer is formed from a Pb-based solder alloy containing small amounts of Sn and In which has good resistance to thermal shocks.

It will be appreciated by those skilled in the art that numerous variations and modifications may be made to the invention as described above with respect to specific embodiments without departing from the spirit or scope of the invention as broadly described.

What is claimed is:

1. A semiconductor packaging metal lid suitable for use in hermetic sealing of a semiconductor package, comprising a metal plate having a solder layer secured to the metal plate by cladding prior to formation of the hermetic seal.

2. The semiconductor packaging metal lid according to claim 1 wherein the solder layer is formed from a lead-based solder alloy having a solidification temperature range falling within the range of from about 240° C. to about 310° C.

3. The semiconductor packaging metal lid according to claim 2 wherein the lead-based alloy contains about 2–6% by weight of Sn, about 0.5–2% by weight of In, and a sufficient amount of Bi to control the solidification temperature range of the alloy so as to fall within the range of from about 240° C. to about 310° C.

4. The semiconductor packaging metal lid according to claim 2 wherein the solder alloy consists essentially, on a weight basis, of about 2–15% Bi, about 2–6% Sn, about 0.5–2% In, about 0.5–2% Ag, and a balance of Pb.

5. The semiconductor packaging metal lid according to claim 1 wherein the solder layer has a thickness in the range of from about 10 μm to about 80 μm.

6. A semiconductor packaging assembly comprising a substrate on which a semiconductor element is to be mounted, and a metal lid having a solder layer for sealing, wherein the metal lid comprises a metal plate having a solder layer secured to the metal plate by cladding prior to formation of the seal between the metal lid and the substrate.

7. The semiconductor packaging assembly according to claim 6 wherein the substrate is a ceramic substrate.

8. The semiconductor packaging assembly according to claim 6 wherein the ceramic substrate has a metallized surface in a sealing area thereof to be joined to the lid.

9. The semiconductor packaging assembly according to claim 6 wherein the solder layer of the lid is formed from a lead-based solder alloy having a solidification temperature range falling within the range of from about 240° C. to about 310° C.

10. The semiconductor packaging assembly according to claim 9 wherein the lead-based alloy contains about 2–6% by weight of Sn, about 0.5–2% by weight of In, and a sufficient amount of Bi to control the solidification temperature range of the alloy so as to fall within the range of from about 240° C. to about 310° C.

11. The semiconductor packaging assembly according to claim 9 wherein the solder alloy consists essentially, on a weight basis, of about 2–15% Bi, about 2–6% Sn, about 0.5–2% In, about 0.5–2% Ag, and a balance of Pb.

12. The semiconductor packaging assembly according to claim 6 wherein the solder layer has a thickness in the range of from about 10 μm to about 80 μm.

* * * * *